United States Patent [19]
Christensen

[11] Patent Number: 4,776,080
[45] Date of Patent: Oct. 11, 1988

[54] WORKPIECE TRANSPORT SYSTEM WITH INDIVIDUALLY CHARACTERIZED OFFSETS

[75] Inventor: Blake Christensen, Piscataway, N.J.

[73] Assignee: Hewlett-Packard Company, Palo Alto, Calif.

[21] Appl. No.: 941,495

[22] Filed: Dec. 15, 1986

[51] Int. Cl.[4] .............................................. B23P 19/00
[52] U.S. Cl. ........................................ 29/430; 29/760; 29/833; 29/834; 269/903
[58] Field of Search ................. 29/833, 834, 760, 430; 269/903, 307, 43; 198/341

[56] References Cited

U.S. PATENT DOCUMENTS

3,854,889 12/1974 Lemelson ............................. 198/341
4,291,867 9/1981 Williams et al. ..................... 269/903

OTHER PUBLICATIONS

Bonales et al., "PWB Work Board Holder–Sliding Locating Pin", Technical Digest, No. 55, Jul. 1979, pp. 3,4.

*Primary Examiner*—Mark Rosenbaum
*Assistant Examiner*—Frances Chin
*Attorney, Agent, or Firm*—Edward L. Miller

[57] ABSTRACT

A workpiece carrier and positioning system determines the particular orientation of each workpiece upon an individually identifiable carrier or frame to which it has been affixed. The carriers themselves are precisely registered at each workstation where an operation is to be performed upon the workpiece. Once registered at a workstation the carrier's identification is determined and the carrier or the operational tool of the workstation is offset and/or rotated as needed, according to the determined particular orientation of the workpiece, to allow precise alignment of the workpiece with the operation to be performed. The offset and/or rotation needed is individually determined for each workpiece at each workstation on the basis of the original particular orientation of each workpiece upon its individual carrier. A table is maintained that associates with each carrier the particular orientation of the workpiece carried thereon. The table allows workpiece orientations upon the carriers to be determined only once for each instance of mounting a workpiece upon a carrier, and also allows carriers to commence the sequence of workstation visits in an order of carriers that may differ from that in which the particular orientations were initially determined.

9 Claims, 4 Drawing Sheets

| CARRIER ID | X OFFSET | Y OFFSET | Θ OFFSET |
|---|---|---|---|
| aaa | $X_a$ | $Y_a$ | $Θ_a$ |
| bbb | $X_b$ | $Y_b$ | $Θ_b$ |
| ggg | $X_g$ | $Y_g$ | $Θ_g$ |
| ddd | $X_d$ | $Y_d$ | $Θ_d$ |
| ttt | $X_t$ | $Y_t$ | $Θ_t$ |
| - - - | $X_k$ | $Y_k$ | $Θ_k$ |
| vvv | $X_v$ | $Y_v$ | $Θ_v$ |

FIG 3A

WORKPIECE TRANSPORT SYSTEM WITH INDIVIDUALLY CHARACTERIZED OFFSETS

BACKGROUND AND SUMMARY OF THE INVENTION

A variety of assembly processes are becoming more and more automated. In the fabrication of printed circuit boards with surface mount components, for example, printed circuit boards can pass from a station that automatically applies a pattern of solder paste to the unloaded board to one that mechanism to register the workpiece (the printed circuit board at hand) in the machine. In the past this has included the use of dowel pins and fences. Owing to their mechanical nature, such methods are not by themselves particularly flexible. Attempts to adapt an existing system of that sort to process parts that are significantly different in size than those originally envisaged can prove difficult.

In the application sketched above, as well as in many other similar ones, it can be advantageous to carry one or more individual workpieces upon a carrier or frame. The workpieces are held firmly in place upon the carrier, but not necessarily precisely in any particular position. Each carrier is separately identified and recognizable (e.g., with machine readable bar coding). At or before the first workstation the particular relative location(s) upon the carrier of the one or more workpieces is determined by a precision locating mechanism. This operation may involve automatic sensing and pattern recognition, and may require the use of targets affixed to or built into the workpiece. The locations of the workpieces are determined relative to some indexing or registration mechanism that positions the carrier at each workstation where an operation is to be performed upon they workpiece. For the sake of simplicity, assume that the same indexing or registration scheme is used for all carriers, and that all carriers are alike. A programmable control mechanism (e.g., a computer) stores the particular relative locations arising out of this particular loading of that carrier with a particular collection of workpieces, and associates those with that particular carrier. Thus, the workpiece locating operation is done only once each time a carrier is loaded with a workpiece. As the carrier proceeds from workstation to workstation each determines (or is perhaps told) which carrier is at hand. After registering the carrier the workstation can then, without further measurement or investigation, position or align either its operating head or the carrier according to the offsets (i.e., the relative location) for the particular workpiece to be operated upon. A further advantage of the invention is that once a carrier and its workpiece have been characterized, they need not necessarily proceed through the sequence of workstations next in order after the carrier/workpiece combination that was just previously characterized. That is, the order of the carriers can be arbitrary.

As an extension of the technique described above, it may be desirable to allow a variable number of workpieces to occupy the carrier. The actual number for each carrier would than be determined automatically at the same time as are the relative locations. Then as the carrier goes from workstation to workstation each will do the appropriate number of operations. And if a workstation determines during its operation that a workpiece is fatally defective, it can "remove" that workpiece from the carrier by deleting it from the list describing the work in progress. Then the next workstation would proceed with its operation as if the carrier had been loaded without that particular workpiece to begin with.

BRIEF DESCRIPTION OF THE DRAWINGS

FIGS. 3A and 3B are illustrative tabular representations of ways certain offsets used in accordance with the method of the invention can be retained in memory.

DESCRIPTION OF THE PREFERRED EMBODIMENT

Figure 1:
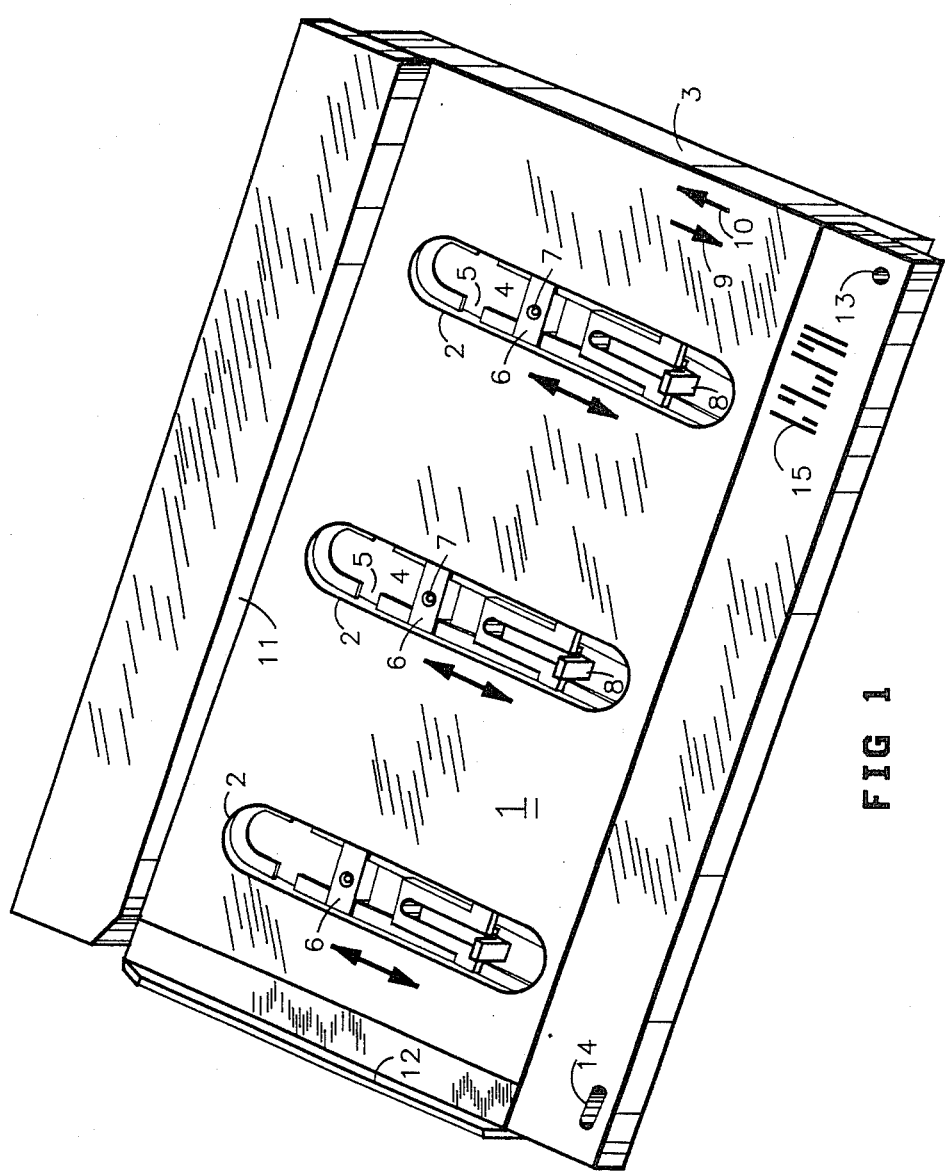
FIG. 1 is a perspective view of a carrier suitable for use with the invention.

Refer now to FIG. 1, where is shown a carrier 1 adapted for use with the invention. It will be understood, however, that the carrier 1 of FIG. 1 is merely illustrative of one way that a carrier can be used with the invention, and that the use of other types of carriers may be desirable, depending upon the circumstances. With that in mind, notice that the carrier 1 is equipped with a plurality of slots 2 in a plate 3. The slots 2 include interior flanges 4 that have gaps 5. The slots 2 and flanges 4 support slidably adjustable clamps 6. A set screw 7 in each clamp allows it to be repositioned in its associated slot, as shown by the double headed arrows in the figure. Gaps 5 allow the clamps 6 to be inserted and removed from the plate 3.

Each clamp 6 includes a spring-loaded finger 8 for gripping an edge of a printed circuit board. The fingers 8 are extensible by the application of force in the direction of the arrow 9. When released, each finger retracts with a force in the direction of arrow 10. A raised fence 11 serves to hold one edge of a printed circuit board while one or more fingers 8 urge the board against the fence 11. A second raised fence 12 may be used to assist in holding a board so that it is both located in a predetermined general part of the carrier 1 and so that the board is less likely to change its orientation during handling.

Before leaving FIG. 1, note the registration hole 13 and registration slot 14. These cooperate with dowel pins at each workstation to locate the carrier therein for performing an operation. Also note the bar coding 15. This serves to uniquely identify each particular carrier, and may, if desired, be a machine readable code read at each workstation. Any suitable type of coding may be employed, including manual entry of a non-machine readable code, if such were desirable.

Figure 2:
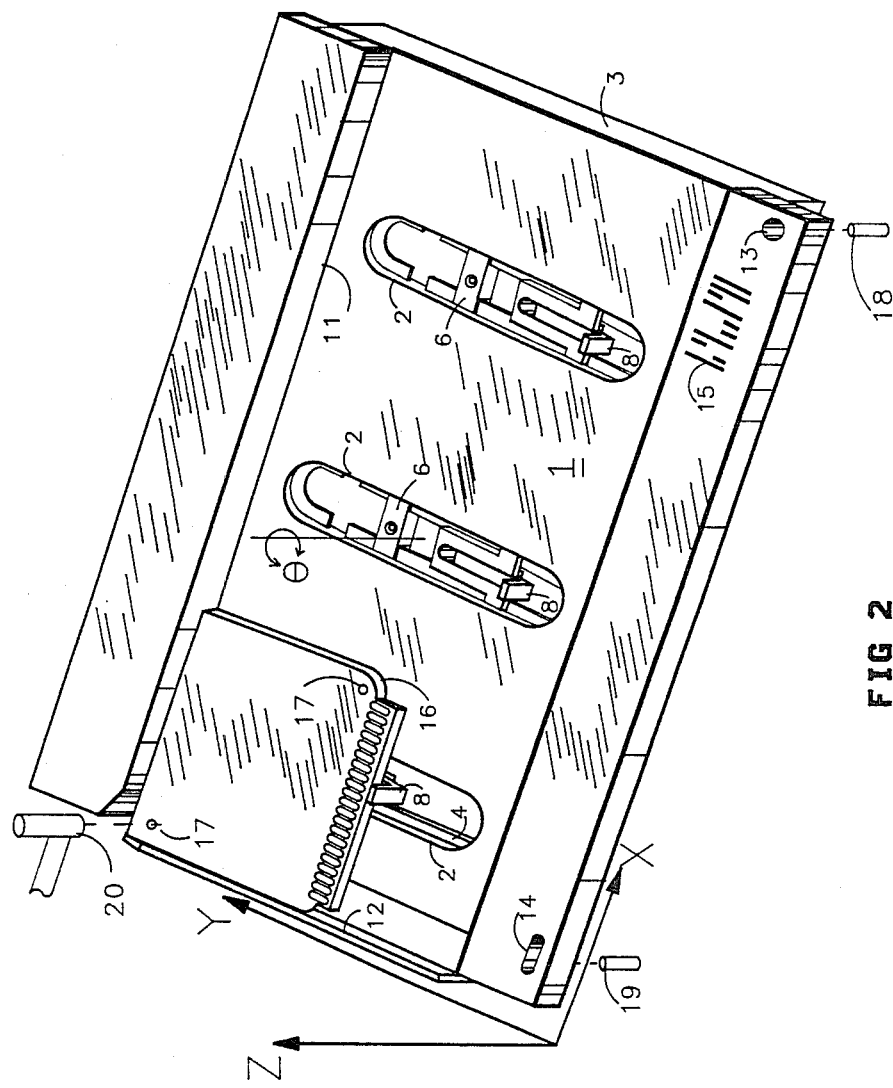
FIG. 2 is a perspective view of the carrier of FIG. 1 with a printed circuit board mounted thereon for processing by automated machinery.

FIG. 2 shows a printed circuit board 16 held against fences 11 and 12 by the action of the left-most spring-loaded finger 8. In one sense, the fences 11 and 12 register the board 16 with as much accuracy as possessed by the manufacturing activities that produced that board. But it is the nature of printed circuit board manufacturing that while very close tolerances can be maintained between features in the traces themselves, the location upon the board blank of the trace pattern itself, considered as a whole, cannot be as easily controlled. It is not unusual to find that it is uneconomical to attempt to control the location of an edge of the printed circuit board, relative to the trace pattern, to any better than fifteen thousandths of an inch. Such uncertainties allow positioning errors that are a substantial fraction of the trace widths and pad sizes used with some surface mounted components, many of which are quite small compared to the conventional parts of, say, ten years ago. Under the worst case conditions of misregistration some automatically applied parts could be so misplaced that they are not simply poorly positioned, but actually cause the assembly to fail electrically. So in another sense, fences 11 and 12 merely position board 16 in a coarse or preliminary fashion.

In operation, the printed circuit board 16 is loaded onto a workpiece carrier 1, substantially as shown in FIG. 2. In one particular embodiment the carrier 1 is placed into a screening machine (not shown) including a translation table capable of linear motion along mutually perpendicular X, Y and Z axes, as well as rotation about a Theta axis parallel to the Z axis. The translation table is equipped with digitizing means for each axis, so that at all times the position of the table can be determined. Representative locations of these axes are shown in FIG. 2, although it will be understood that there are many possible locations for these axes. The carrier itself is registered on the translation table by dowel pins 18 and 19 that project into hole 13 and slot 14 of the carrier 1. The operator then informs the monitoring control system of (i) the type of board to be operated upon (so that the correct collection of operations will be performed, and not those corresponding to a different type of board), and (ii) the carrier identification code 15. Alternatively, these data may be determined through inspection procedures conducted by the monitoring control system itself.

Once the operating cycle has been initiated the following actions occur. Based upon knowing what particular printed circuit board is at hand, a photo-sensor 20 is moved from an out-of-the-way position to a known position suitable for sensing targets 17 upon the printed circuit board 16. The Z axis actuator brings the carrier 1 to a height that puts the top surface of the board 16 just below the bottom of the photo-sensor 20. The X and Y axis actuators position the board such that a first target is in the vicinity of the photo-sensor 20. In the present embodiment the targets 17 are each a reflective solid circle of trace material, perhaps sixty thousandths of an inch in diameter. Once the first target is in the vicinity of the photo-sensor it is (by design) also in the field of view thereof. In an alternate embodiment it may be desirable to employ a hunting algorithm to locate the first target on an arbitrarily placed board. Once the first target is in the field of view of the sensor, the X and Y axes are then each separately changed to pass the opposing edges of the target through the field of view. This produces from the X axis digitizing means a pair of X-edge values whose average is the X coordinate of the center of the target, and from the Y axis digitizing means an associated pair of Y-edge values whose average is the Y coordinate of the target the (X,Y) location of the center of the selected target. Based upon this information the locus of all possible positions of the second target can be determined. Such a determination may be unnecessary if the placement of the printed circuit board 16 is non-arbitrary, as is the case when fences 11 and 12 are employed. In such a case it is possible to estimate the location of the second target directly.

The X and Y axes are then translated to the vicinity of the second target. Subsequent variations in the separate axes then produce, as for the first target, the location of the center of the second target. Based upon this information an X, Y, Theta offset is computed which describes the location of the particular board 16 upon the particular carrier 1 that happens to be in use. The Theta offset describes any rotation needed to make the local X-Y axes of the board 16 be parallel to the actual X-Y axes of the workstation.

At this time the sensor 20 is withdrawn, and a tabular entry in memory is created that associates the X, Y, Theta offset with the carrier ID number of the carrier/workpiece combination whose offsets were just found. The table entry is used to bring the board 16 and the operations to be performed at the workstations into alignment. That alignment can be obtained in two basic ways, depending upon the type of machine performing the operation at each workstation, as described below.

For one class of operations, such as applying a pattern of material through a screen, the entire operation occurs as an indivisible unit. In the case of screening, either the carrier is translated and rotated, the screen is translated and rotated, or (less likely), one is translated and the other rotated. In one actual apparatus built to embody the method of the invention the screen remains fixed (except for the motion required to bring it in and out of contact with the printed circuit board) and the carrier is translated and rotated when it reaches the screening workstation.

For another class of operations, such pick and place operations having several degrees of freedom and used to apply individual components one at a time, the carrier may remain fixed in its original registration position at that workstation. The translation and rotation are simply used to adjust the various individual manipulations of the placement mechanism.

The transformations that relate coordinate systems by the rotation of and translation of axes are known in themselves. A description of these may be found in almost any text on analytic geometry. See, for example, pages 65-70 and 314-321 of *CALCULUS WITH ANALYTIC GEOMETRY*, by Edwin J. Purcell, 1965, Meredith Publishing Co.

One possible tabular representation of the offsets for X, Y and Theta is shown in FIG. 3A. This method has the advantage of accommodating arbitrary carrier identification codes. As shown in the figure, each entry in the table consists of four elements: a carrier identification code and the associated offsets for X, Y and Theta. The table grows "down from the top" and may have as many entries as needed or as is practical. The main idea of the data structure represented by FIG. 3A is that each table entry has four elements: the carrier ID and its associated offsets. Notice also that carrier identifiers may be added to the list in any order, and that it is easy to "delete" an entry from the list. In the example carrier identifier "kkk" has been replaced by a null indicator "---". Depending upon the manner of programming used, it may also be desirable to maintain an "end of list" symbol.

To add an entry to this type of table one searches the entire table by carrier ID to see if an old entry for that same ID already exists. If one does, then it is overwritten by the new one. If one does not, then a new entry is created at the end of the list. To find the offsets for a particular carrier it is necessary to search for an entry having that ID.

Figure 3B:
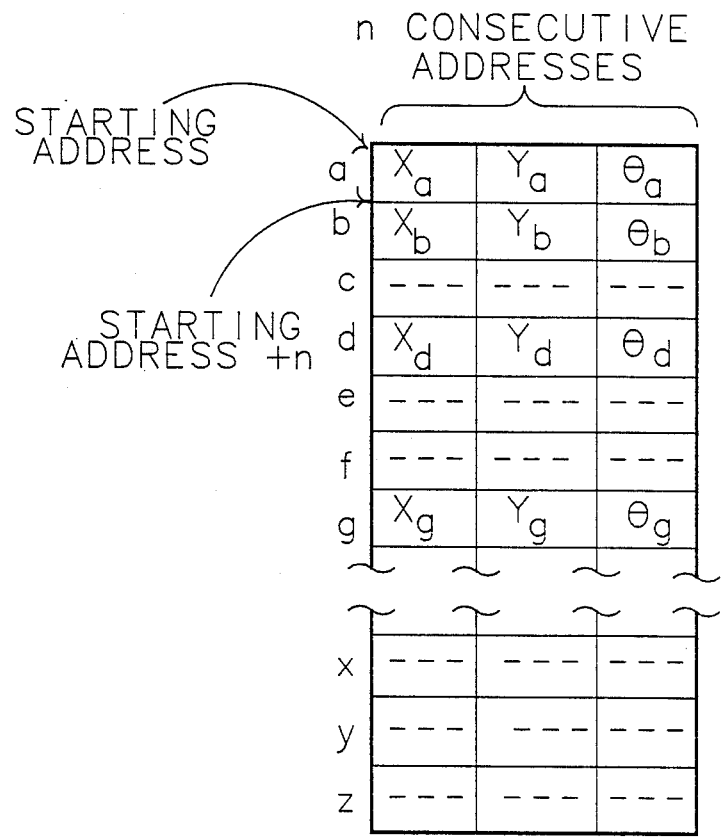

FIG. 3B illustrates another way to implement a table of offsets for practicing the invention. In this case the entries into the table consist of sets of three elements: the offsets for X, Y and Theta. The sets are in order by possible carrier identifiers. Deleted or blank entries are represented by null values.

To access an entry in this type of list one merely uses the ID as an index into the list. This is easy to do if the carrier identification codes are integers of the appropriate radix, otherwise some sort of conversion may be necessary.

I claim:

1. A method of aligning an operation and a workpiece at a workstation comprising the steps of:

affixing a plurality of targets to a workpiece in known locations relative to portions thereof to be operated upon at the workstation;

mounting the workpiece to a carrier which is precisely registerable at a registration station and at a workstation;

registering the carrier at the registration station to align the carrier with a reference coordinate system;

determining at the registration station, by automatic machine controlled inspection of the targets offsets and a rotation of the known locations of the workpiece relative to the reference coordinate system;

storing the determined offsets and rotation with machine readable form in a storage location;

registering the carrier at the workstation;

reading the determined offsets and rotation from the storage location; and aligning the workpiece and an operation performed at the workstation to compensate for the offsets and rotation of the workpiece relative to the reference coordinate system.

2. A method as in claim I wherein the aligning step comprises the step of compensational positioning of the carrier to align the workpiece with the reference coordinate system.

3. A method as in claim 1 wherein the carrier remains unmoved while registered at the workstation and the operation to be performed is divisible into a plurality of independently alignable tasks each performed by an operations means with sufficiently many degrees of freedom to compensate for the offsets and rotation of the workpiece, and wherein the aligning step comprises the step of compensational positioning of the operations means during the performance of its tasks.

4. A method of aligning a workpiece and a plurality of operations performed at a plurality of workstations comprising the steps of:

affixing a plurality of targets to a workpiece in known locations relative to portions thereof to be operated upon at a workstation;

mounting the workpiece to a carrier which is precisely registerable at a registration station and at each workstation;

registering the carrier at the registration station to align the carrier with a reference coordinate system;

determining at the registration station, by automatic machine controlled inspection of the targets, offsets and a rotation of the known locations of the workpiece relative to the reference coordinate system;

storing the determined offsets and rotation with machine readable form in a storage location;

registering the carrier at a first workstation;

reading the determined offsets and rotation from the storage location;

aligning the workpiece and an operation performed at the first workstation to compensate for the offsets and rotation of the workpiece relative to the reference coordinate system;

registering the carrier at a second workstation;

reading the determined offsets and rotation from the storage location; and aligning the workpiece and an operation performed at the second workstation to compensate for the offsets and rotation of the workpiece relative to the reference coordinate system.

5. A method as in claim 4 wherein at least one of the aligning steps comprises the step of compensational positioning of the carrier to align the workpiece with the reference coordinate system.

6. A method as in claim 4 where in the carrier remains unmoved while registered at least one of the workstations and the operation to be performed thereat is divisible into a plurality of independently alignable tasks each performed by an operations means with sufficiently many degrees of freedom to compensate the offsets and rotation of the workpiece, and wherein an aligning step associated with one such workstation comprises the step of compensational positioning of the operations means during the performance of its tasks.

7. A method of aligning a plurality of workpieces and an operation to be performed at a workstation comprising the steps of:

affixing to each workpiece a plurality of targets in know locations relative to the portions thereof to be operated upon at the workstation;

mounting each workpiece to an associated carrier having a unique carrier identification code and which is precisely registerable at a registration station and at a workstation;

registering each carrier at the registration station to align that carrier with a reference coordinate system;

determining for each workpiece at the registration station, by automatic machine controlled inspection of the targets, offsets and a rotation of the known locations of the workpiece relative to the reference coordinate system;

storing the determined offsets and rotation with machine readable form in a storage location associated with the carrier identification code;

registering each carrier at the workstation;

detecting the carrier identification code;

reading the determined offsets and rotation from the storage location associated with the detected carrier identification code; and aligning each workpiece and an operation performed at the workstation to compensate for the offsets and rotation of the workpiece relative to the reference coordinate system.

8. A method as in claim 7 wherein the aligning step comprises the step of compensational positioning of the carrier to align the workpiece with the reference coordinate system.

9. A method as in claim 7 wherein the carrier remains unmoved while registered at the workstation and the operation to be performed is divisible into a plurality of independently alignable tasks each performed by an operations means with sufficiently many degrees of freedom to compensate for the offsets and rotation of the workpiece, and wherein the aligning step comprises the step of compensational positioning of the operations means during the performance of its tasks.

* * * * *